(12) United States Patent
Coenen

(10) Patent No.: US 9,638,759 B2
(45) Date of Patent: *May 2, 2017

(54) POWER CELL SYSTEM WITH MEANS FOR DETECTING A DISCONTINUITY

(71) Applicant: VITO NV, Mol (BE)

(72) Inventor: Peter Coenen, Glabbeek (BE)

(73) Assignee: VITO NV, Mol (BE)

( * ) Notice: Subject to any disclaimer, the term of this patent is extended or adjusted under 35 U.S.C. 154(b) by 204 days.

This patent is subject to a terminal disclaimer.

(21) Appl. No.: 14/534,630

(22) Filed: Nov. 6, 2014

(65) Prior Publication Data

US 2015/0108990 A1    Apr. 23, 2015

Related U.S. Application Data

(63) Continuation of application No. 13/254,274, filed as application No. PCT/EP2010/053550 on Mar. 18, 2010, now Pat. No. 8,907,676.

(30) Foreign Application Priority Data

Mar. 18, 2009   (EP) .................................. 09155534

(51) Int. Cl.
  *G01N 27/416*   (2006.01)
  *G01R 31/36*   (2006.01)
  (Continued)

(52) U.S. Cl.
  CPC ......... *G01R 31/362* (2013.01); *G01R 31/026* (2013.01); *H01M 8/04559* (2013.01); *H01M 8/04679* (2013.01); *H01M 10/425* (2013.01); *H01M 10/482* (2013.01); *G01R 31/2829* (2013.01); *G01R 31/3658* (2013.01); *H01M 16/003* (2013.01); *H01M 2008/1095* (2013.01); *Y02E 60/50* (2013.01)

(58) Field of Classification Search
  CPC ............................ G01R 31/362; G01R 31/026
  USPC .................................................. 324/426, 433
  See application file for complete search history.

(56) References Cited

U.S. PATENT DOCUMENTS 4,187,504 A * 2/1980 Cantrell ............... G01R 31/026
                                                                 246/34 CT
4,228,394 A   10/1980 Crosby
                    (Continued)

FOREIGN PATENT DOCUMENTS

| EP | 1391962 A1 | 2/2004 |
| JP | 2006153758 A | 6/2006 |
| WO | 2007119682 A1 | 10/2007 |

OTHER PUBLICATIONS

International Preliminary Report on Patentability in PCT/EP2010/053550, Mar. 1, 2011.
(Continued)

*Primary Examiner* — M'baye Diao
(74) *Attorney, Agent, or Firm* — Bacon & Thomas, PLLC

(57) ABSTRACT

A power cell system, e.g. a fuel cell system, having a plurality of power cells, e.g. fuel cells and plurality of first resistances, the plurality of power cells and first resistances being connected in the form of a ladder circuit, and electronic filters each having a first connection to a first node between two of the first resistances, each electronic filter comprising a second resistance and a charge storage device connected to the second resistance.

37 Claims, 3 Drawing Sheets

(51) Int. Cl.
  *G01R 31/02*    (2006.01)
  *H01M 8/04537*  (2016.01)
  *H01M 8/04664*  (2016.01)
  *H01M 10/42*    (2006.01)
  *H01M 10/48*    (2006.01)
  *G01R 31/28*    (2006.01)
  *H01M 16/00*    (2006.01)
  *H01M 8/1018*   (2016.01)

(56) References Cited

U.S. PATENT DOCUMENTS

| | | | |
|---|---|---|---|
| 4,433,294 A * | 2/1984 | Windebank | G01R 31/3627 |
| | | | 320/162 |
| 6,130,530 A | 10/2000 | McNulty | |
| 6,157,165 A | 12/2000 | Kinoshita et al. | |
| 6,211,513 B1 * | 4/2001 | Brown | G01R 27/18 |
| | | | 19/0.21 |
| 6,255,826 B1 | 7/2001 | Ohsawa et al. | |
| 6,420,877 B1 * | 7/2002 | Replogle | G01R 31/026 |
| | | | 324/525 |
| 6,919,706 B2 | 7/2005 | Furukawa | |
| 7,612,530 B2 | 11/2009 | Konishi et al. | |
| 7,626,359 B2 | 12/2009 | Imai | |
| 2004/0004481 A1 | 1/2004 | Jin | |
| 2006/0103351 A1 | 5/2006 | Tanigawa et al. | |
| 2006/0153758 A1 | 7/2006 | Cheung | |
| 2006/0233004 A1 | 10/2006 | Furukawa et al. | |
| 2007/0196707 A1 | 8/2007 | Komachiya et al. | |
| 2008/0143298 A1 | 6/2008 | Yoshida | |

OTHER PUBLICATIONS

International Search Report in PCT/EP2010/053550, May 6, 2010.
Written Opinion of ISA in PCT/EP2010/053550, May 6, 2010.
Japanese Office Action for related JP 2012-500257, dated Dec. 3, 2013, and English translation thereof.

* cited by examiner

POWER CELL SYSTEM WITH MEANS FOR DETECTING A DISCONTINUITY

FIELD OF THE INVENTION

The present invention relates to the field of electrical power cells such as fuel cell or battery systems, and to means for monitoring the power cells and means for detecting a discontinuity in the monitoring means, especially for detecting an open circuit in a wire or cable of the monitoring means.

BACKGROUND OF THE INVENTION

Generally DC power supplies such as fuel cells or batteries only have a low voltage difference per cell. This means the batteries or cells are often connected in series in order to obtain a useful working voltage. It is customary to provide some form of monitoring circuit for such a chain or ladder of cells.

A fuel cell is a device, which converts chemical energy into electrical energy, where the functionality is as follows: A fuel on the anode side and an oxidant on the cathode side react in the presence of an electrolyte generating a charge difference between the anode side and the cathode side. An appliance can now be connected via wires or cables to the anode side and the cathode side. A fuel cell system comprises several, at least two fuel cells, wherein each of the fuel cells is connected to the adjacent fuel cell in a serial connection. In consideration of the voltage needed an appliance can be connected to a number of fuel cells connected in series to provide the appropriate voltage. In case of a discontinuity in the electricity supply the applied voltage to the appliance is lowered and therefore the function of the appliance is affected. Even worse, the fuel may be supplied to a fuel cell even though it is not functioning correctly. As the fuel is not consumed there is a danger it may be exhausted to the environment.

One of the solutions of this problem is a cell voltage monitor (CVM), which is commercially available. Each of the fuel cells needs to be connected to the CVM separately.

The CVM detects a deviation of the voltage of a fuel cell from an average voltage of a fuel cell system and takes actions like notification of the actual voltage or a shutdown of the fuel cell system. During start-up and shutdown the voltage of a fuel cell can drop under the value of 0 V, which means the CVM must be able to distinguish between transient states of the fuel cells, a failure of the CVM or of a fuel cell. Hence a connectivity check of the wires or cables of the CVM is required.

Conventional solutions of the prior art are for instance demonstrated in JP 2006/153758, which proposes a fuel cell system comprising four fuel cell groups with two fuel cells in each fuel cell group, which are connected in a serial connection comprising a wire connected to each fuel cell. Each of the wires is directed to a low-pass filter, which is grounded and supplied with electricity by a separate voltage supply. Since each of the low-pass filters are provided with a separate voltage supply, two switches are needed to charge and discharge the capacitance of the low-pass filters, which makes a connectivity check complex and expensive.

US 2007/0196707 A1 proposes a fuel cell system, which is divided into several fuel cell portions. A connection check is made by measuring the voltage of each fuel cell portion compared to a ground, and amplifying the measured voltage via two band-pass filters to a signal processing unit. The voltage over the fuel cell portion is then compared with a mean voltage of the fuel cell system, wherein a deviation is an indication of a discontinuity of the electricity supply. A disadvantage of this embodiment is that only the voltage of a fuel cell portion compared to the ground can be measured and not the voltage of a single fuel cell, which makes it difficult to localize the discontinuity in one of the wires.

SUMMARY OF THE INVENTION

It is an object of the invention to provide a device for use with a power cell system and method of operating a power cell system such as a fuel cell, electrolytic cell or battery system, the device having simple and cheap means for monitoring the cells and for detecting a discontinuity in connections to the cells.

The device and the method according to the invention may be in particular used in power cell systems using fuel cells and ultracaps. Ultracaps and fuel cells have a common feature distinguishing them from many other electrochemical cells in that zero volts is a normal operating voltage for the former. Detecting connectivity at zero volts across the electrochemical cell is a particular object of the present invention.

The present invention provides, a device for detecting a discontinuity in electrical connections to power cells of a power cell system, the power cell system having a plurality of power cells, the device for detecting comprising: a plurality of first resistances, the plurality of power cells and first resistances being for connection in the form of a ladder circuit, and electronic filters each having a first connection to a first node of the ladder circuit between two of the first resistances, each electronic filter comprising a second resistance and a charge storage device connected to the second resistance.

In one embodiment a power cell system, e.g. a fuel cell system, is provided comprising a plurality of power cells, e.g. fuel cells and plurality of first resistances, the plurality of power cells and first resistances being connected in the form of a ladder circuit, and electronic filters each having a first connection to a first node between two of the first resistances, each electronic filter comprising a second resistance and a charge storage device connected to the second resistance. The resistances may be resistors, a resistor circuit or other types of resistors such as diode connected transistors. The resistances can be connected in a shunt resistor network, In a further embodiment each of the electronic filters is also connected via a second connection to its adjacent electronic filter. The connection of each electronic filter to the adjacent one makes the electronic filters of the fuel cell system work without any separate voltage supplies, because each of the electronic filters is connected to its own power cell, e.g. fuel cell. From this it follows that there is according to each electronic filter only one switch needed, which makes the fuel cell system simpler and cheaper.

The power cells may be fuel cells, batteries or battery cells, for example. The battery cells may be electrolytic cells. The charge storage device can be a capacitor, a capacitor network or circuit or any other charge storage device.

Preferably, each of the electronic filters is a low-pass filter. A low-pass filter has the advantage that it shows no influence on a direct current which is the case for a fuel cell and filters the high frequency portion of voltage changes, which is can be used to perform connectivity checks.

Each electronic filter is connected to a first or input resistance and since each of the input resistances is a shunt resistor for connection across the corresponding power cell, e.g. fuel cell, and for limiting the output voltage of each power cell, e.g. fuel cell, the fuel cells are never in an open circuit. A permanent electrical current flowing through each fuel cell during operation limits carbon corrosion in PEM fuel cells. One other advantage is that an input resistance helps to detect the discontinuity in the electric power supply.

According to a further preferred embodiment each input resistance is connected to its adjacent input resistance. A serial connection of input resistances for connection in parallel to the fuel cells in a ladder circuit provides a voltage divider, where each input resistance generates an input voltage for the corresponding electronic filter, wherein the generated voltage of each of the input resistances are all equal.

Generally, a second or active resistance of each electronic filter is much smaller compared to the corresponding first or input resistance. In this case the effect of the electronic filter on the direct current of the fuel cell is insignificant and an electrical current flowing through the input resistances is also negligible. The electronic filter only affects the dynamic response making a connectivity check possible. Accordingly, every input resistance is of equal value, to provide the same constant voltage to each electronic filter. According to a preferred embodiment of the invention, an output of each electronic filter is connected to a voltage measuring unit such as an analogue/digital converter, to transmit a value, e.g. a digital voltage value to the CVM.

According to a further preferred embodiment of the invention, an electric switch is arranged for each electronic filter, wherein the switch changes the voltage at the output of the corresponding electronic filter. By means of changing the voltage, e.g. raising or lowering, or short-circuiting the output of an electronic filter a charge storage device such as a capacitance of the electronic filter is charged/discharged abruptly. In case of an opening of one switch the charge storage device of the corresponding electronic filter is charged via the corresponding power cell, e.g. fuel cell again. In case of a discontinuity in the connections to the power cell, e.g. fuel cell the charge storage device of the electronic filter is charged through the adjacent electronic filters, wherein the charging process shows a longer half-life. The change in dynamic response of the charge storage device is detected via a voltage measuring unit, e.g. an analogue digital converter of the CVM.

Generally, each of the power cells, e.g. fuel cells is for connection with one wire to an input of the corresponding electronic filter, keeping the circuit simple and cheap.

In general, each of the power cells, e.g. fuel cells is for connection to an adjacent power cell, e.g. fuel cell, for establishing a series connection of the power cells that make up the power cell system. Generally, all the impedances of the electronic filters are equal, to make sure that in case of discontinuity in the electrical supply the output of each electronic filter shows the same output voltage.

According to an alternative improvement of the invention an external voltage source is arranged for connection between one of the switches and a first pole, e.g. a minus pole of the power cell system. This arrangement makes it possible to detect a discontinuity in a grounding wire or cable, which is connected to the first pole, e.g. minus pole of the power cell system, since this is not possible without an external voltage source.

According to an alternative improvement on the invention an external voltage source is arranged for connection between each of the switches and the first pole, e.g. the minus pole of the power cell system, to detect a disconti- nuity of the electrical supply in case of the power cell showing an output voltage of zero volts.

According to an alternative improvement on the invention the switch is arranged for coupling to the power cell comprising the first, e.g. minus pole of the power cell system is connected to the first, e.g. minus pole of the external voltage source, to detect a discontinuity of the electrical supply in case of the power cells show an output voltage of zero volts and a ground wire or cable is disconnected.

The present invention also provides, a method for detecting a discontinuity in electrical connections to power cells in a power cell system, the system comprising:
a plurality of power cells and a plurality of electronic filters each having a connection to an electrode of a power cell, each of the plurality of electronic filters comprising a resistance and a charge storage device connected to the resistance, the method comprising:
discharging the charge storage devices while maintaining the connections to the power cells,
recharging the charge storage devices from the power cells and
monitoring a dynamic voltage on the charge storage device to determine if there is a discontinuity in electrical connections to the power cells.

The process for a connectivity check in the fuel cell system provides, that in case of disconnection or transection of one of the connections to the power cells, the capacitance of the charge storage device of the corresponding electronic filter is charged through the adjacent electronic filters. Thus, the procedure of charging and discharging of the capacitance of the electronic filter is warranted.

Also as the connections remain during the connectivity check the test can be carried out at regular intervals over a period of time.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
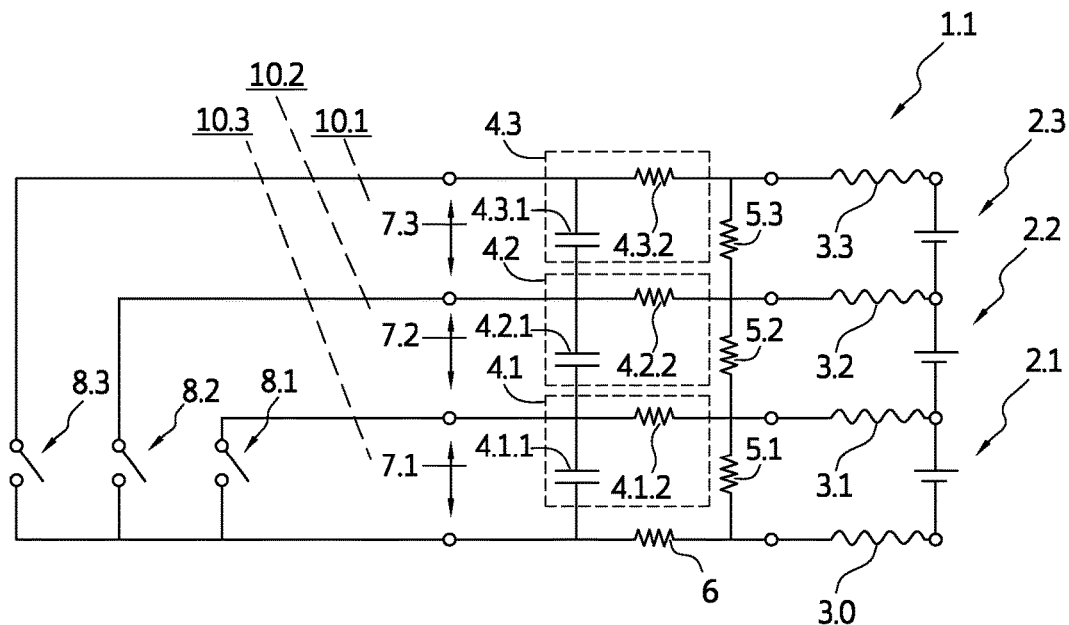
FIG. 1 shows a circuit of a fuel cell system comprising three fuel cells and correspondingly three low-pass filters where each low-pass filter is connected to the adjacent low-pass filter.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

In the present application i.e. in the description, the claims and the drawings the term power cell means any kind of cell storing or generating energy like a battery, an electrochemical cell, a fuel cell, a solar cell or an ultracap (an electrochemical double layer capacitor). By power cell system is meant a system comprising power cells.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 4:
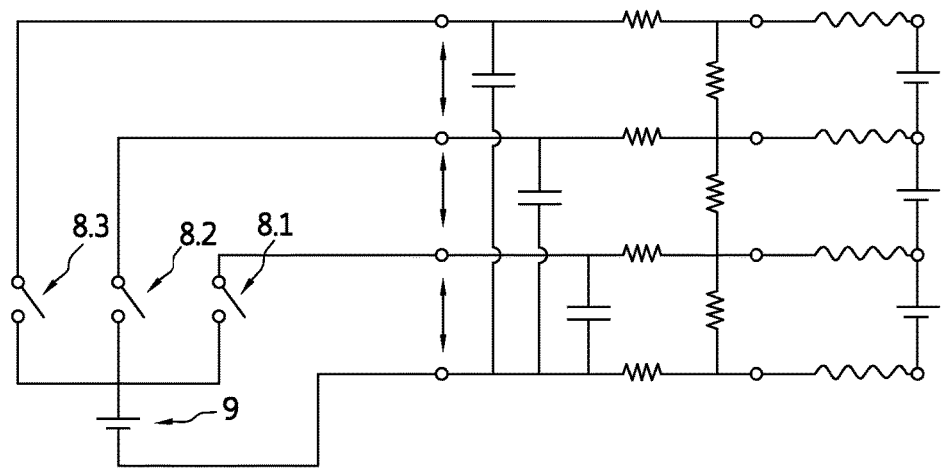
FIG. 4 shows a circuit of a fuel cell system according to FIG. 3, wherein the switch according to the fuel cell comprising the minus pole of the fuel cell system is connected to the minus pole of the external voltage source.
Figure 5:
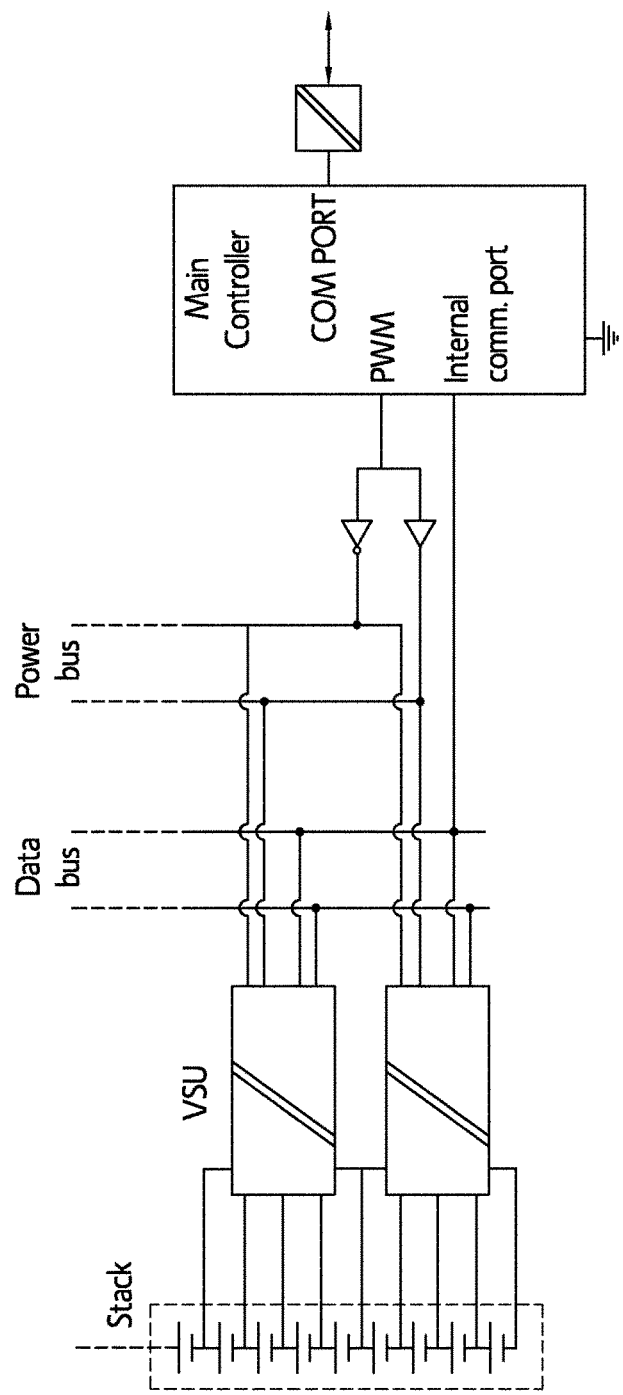
FIG. 5 shows a circuit of a voltage monitoring system for a stack of fuel cells with which the present invention can be used.

FIG. 5 shows a schematic arrangement of a Cell Voltage Monitor (CVM) according to an embodiment of the present invention. The CVM is for use with a stack of power cells such as fuel cells, battery cells, electrolytic cells or similar. The CVM can be a separate device for connection to the power cells and comprises connections to one or more Voltage Scanning Units (VSU) and a main controller. In an embodiment of the present invention the VSU includes a voltage monitoring unit and optionally switches as will be described with reference to FIGS. 1 to 4. The VSU can pre-process measured data so that only relevant data is sent on a communication bus to a main controller. The pre-processing maybe implemented in software or by another form of programmable logic, e.g. an FPGA. A wire disconnection fault in one of the connections results in the CVM giving false readings. It is an object of the present invention to provide a CVM in which connection failures can be distinguished from power cell failures.

The present invention provides a device for detecting connectivity failures in wires for connecting to a power cell system. The present invention also provides a power cell system having such a means for detecting connectivity in wiring to the cells. FIG. 1 shows a circuit of a power cell, e.g. a fuel cell, electrolytic cell or battery system 1.1 according to a first embodiment of the present invention which can be used with a device for detecting connectivity in the CVM. Power cells according to the embodiments of the present invention can be used in a wide variety of application, for example, to power automotive vehicles such as buses, cars, motobicycles, scooters, bicycles; or boats, trains, vending machines, vacuum cleaners, motorway road signs, electronic devices, hospital equipment, wastewater treatment plants, etc.

Reference will be made in the following to fuel cells but the present invention is not limited thereto. For each reference to a "fuel cell" the term "cell" can be used whereby the term "cell" includes fuel cells, battery cells, electrolytic cell or any other form of DC power cell. A first fuel cell 2.1, a second fuel cell 2.2 and a third fuel cell 2.3 are arranged in the order mentioned in a serial connection. A ground wire or cable 3.0 is optionally connected to a first pole, e.g. the minus pole of the first fuel cell 2.1, whereby the minus pole of the first fuel cell is the first pole, e.g. the minus pole of the fuel cell system. A first wire 3.1 is connected on one side to the second pole, e.g. the positive pole of the first fuel cell 2.1 and the first pole, e.g. minus pole of a second fuel cell 2.2, respectively, and on the other side to the input of a first low-pass filter 4.1, which comprises a first charge storage device, e.g. capacitor 4.1.1 and a first active resistance 4.1.2. A first input resistance 5.1 is connected to the first wire 3.1 and the ground wire or cable 3.0 and operates as a shunt resistor. An earth-resistance 6 connects the ground wire or cable 3.0 and the earth resistance 6, respectively, to the capacitance 4.1.1 of the first low-pass filter 4.1.

A second wire 3.2 is on one side connected to the second pole, e.g. positive pole of the second fuel cell 2.2 and the first pole, e.g. minus pole of a third fuel cell 2.3, respectively, and on the other side to a second low-pass filter 4.2, which comprises a second charge storage device, e.g. a second capacitance 4.2.1 and a second active resistance 4.2.2. The second capacitance 4.2.1 of the second low-pass filter 4.2 is connected to the output of the first low-pass filter 4.1 and a second input resistance 5.2 connects the input of the second low-pass filter 4.2 and the second wire 3.2, respectively, to the input of the first low-pass filter 4.1 and acts as a shunt resistor.

A third wire 3.3 is on one side connected to the second pole, e.g. positive pole of the third fuel cell 2.3, which is the second pole, e.g. positive pole of the fuel cell system and on the other side to a third low-pass filter 4.3, which comprises a third charge storage device, e.g. a third capacitance 4.3.1 and a third active resistance 4.3.2. A third input resistance 5.3 connects the input of the third low-pass filter 4.3 and the third wire 3.3, respectively, to the input of the second low-pass filter 4.2 and acts as a shunt resistor.

It is obvious that the arrangement of the circuit according to the fuel cell system 1.1 is able to be continued with further fuel cells and one low-pass filter associated with each fuel cell so that an $n^{th}$ wire 3.$n$ is on one side connected to the second pole, e.g. positive pole of the $n^{th}$ fuel cell 2.$n$, which is the second pole, e.g. positive pole of the fuel cell system and on the other side to an $n^{th}$ low-pass filter 4.$n$, which comprises an $n^{th}$ charge storage device, e.g. an $n^{th}$ capacitance 4.$n$.1 and an $n^{th}$ active resistance 4.$n$.2. An $n^{th}$ input resistance 5.$n$ connects the input of the $n^{th}$ low-pass filter 4.$n$ and the $n^{th}$ wire 3.$n$, respectively, to the input of the n−1$^{th}$ low-pass filter 4.$n$−1 and acts as a shunt resistor.

A first differential output 7.1 of the first low-pass filter 4.1 is connected to a first voltage monitoring unit 10.1 that is optionally a first analogue to digital (A/D) converter and can be bypassed by a first switch 8.1. A second differential output 7.2 of the second low-pass filter 4.2 is also connected to a second voltage monitoring unit 10.2 that is optionally a second analogue to digital converter and can also be bypassed by a second switch 8.2. And a third differential output 7.3 of the third low-pass filter 4.3 is connected to a third voltage monitoring unit 10.3 that is optionally a third analogue to digital converter and can be bypassed with a third switch 8.3 too. The three voltage monitoring units (that is optionally the three analogue to digital converters) associated to outputs 7.1, 7.2 and 7.3 are part of a CVM. Furthermore, all input resistances 5.1, 5.2 and 5.3 are of equal value, all of the capacitances of the three charge storage devices 4.1.1, 4.2.1 and 4.3.1 are of equal value, and all three of the active resistances 4.1.2, 4.2.2 and 4.3.2 are of equal value. Further, the input resistances 5.1, 5.2 and 5.3 are of much larger value than the corresponding active resistances 4.1.2, 4.2.2 and 4.3.2, e.g. 5 times, 10 times 20 times bigger. The switches 8.1, 8.2 and 8.3 need not have ground potential on their normally open pole. An intermediate voltage between the voltage of a power cell and ground or a voltage higher than the voltage of a power cell would also be able to be used.

In the following the voltage monitoring units 10.1, 10.2 and 10.3 have been omitted from the drawings for clarity purposes. Further although the voltage monitoring units have been shown separately from the switches, these components may all be integrated into a microcontroller for example.

In general (this variation not being shown in the drawings), an $n^{th}$ differential output 7.$n$ of the $n^{th}$ low-pass filter 4.$n$ is connected to an $n^{th}$ voltage monitoring unit that is optionally a first analogue to digital (A/D) converter and can be bypassed by an $n^{th}$ switch 8.$n$. The $n^{th}$ voltage monitoring unit associated to output 7.$n$ is also part of the CVM. Furthermore, the resistance value of the $n^{th}$ input resistance 5.$n$ is the same for all input resistances 5.1, 5.2, the capacitance of the $n^{th}$ charge storage device is the same as all of the capacitances 4.1.1, 4.2.1 and 4.3.1, and the $n^{th}$ active resistance is the same as all of the active resistances 4.1.2, 4.2.2 and 4.3.2.

In case of a normal operation all of the three outputs 7.1, 7.2 and 7.3 show the same output voltage. In case of a discontinuity of the electricity supply, a disconnection or transection of the second wire 3.2 for example, the output voltage of the output 7.2 will be the voltage of the second fuel cell 2.2 plus the voltage of the third fuel cell 2.3 divided by 2: $(U_{2.2}+U_{2.3})/2$. Measuring the output voltages of the two outputs, in this case the second output 7.2 and the third output 7.3, can be an indication of a discontinuity. However there is a danger that if $U_{2.2}$ and $U_{2.3}$ are very nearly the same then there is no significant difference between $(U_{2.2}+U_{2.3})/2$ and either $U_{2.2}$ or $U_{2.3}$. This makes an alternative connectivity check necessary.

Assuming that the one pole of the switches is at ground potential for sake of argument, for the connectivity check the three switches 8.1, 8.2 and 8.3 are closed simultaneously, which leads to an abrupt discharge of the three capacitances 4.1.1, 4.2.1 and 4.3.1. The switches 8.1, 8.2 and 8.3 are then opened simultaneously and recharging of the three capacitances 4.1.1, 4.2.1 takes place. If one of the wires, in this case for example the second wire 3.2, is disconnected, the second capacitance 4.2.1 is charged through the adjacent input resistance and low-pass filter of the neighbouring cell, in this case the third input resistance 5.3 and the third low-pass filter 4.3, which leads to a different dynamic response of the voltage on the relevant capacitor, e.g. a lower voltage at half life of the dynamic response on capacitance 4.2.1 than in for the others. The second voltage monitoring unit, e.g. analogue to digital converter, measures the dynamic response, e.g. measures after a predefined time delay after opening of the second switch 8.2, the output voltage of the output 7.2. The second output voltage 7.2 indicates a bad connection, in this case for the second wire 3.2, if the dynamic response differs from normal operation, e.g. if the second output voltage 7.2 is at the measuring time lower than the other output voltages.

An alternative description of the circuits of the first embodiment is as follows which is functionally equivalent to the description above. The power cells 2.1 to 2.3 are connected in a first ladder circuit comprising the power cells 2.1 to 2.3 and first resistors 5.1 to 5.3. The "rungs" of the ladder are formed by the connections 3.0 to 3.3 which form first nodes between the power cells 2.1 to 2.3. The resistors 5.1 to 5.3 are also connected in a second ladder circuit with capacitors 4.1.1 to 4.3.1. Second nodes between the resistors 5.1 to 5.3 are connected to third nodes between the charge storage devices, e.g. capacitors 4.1.1 to 4.3.1 via second resistors 4.1.2 to 4.3.2. The third nodes are connected to voltage monitoring units, e.g. analogue to digital converters as described above as well as to short-circuiting switches 8.1 to 8.3. Operation is as described previously. Use is made of the dynamic change of the voltages on the third nodes as measured by the voltage monitoring units, e.g. analogue to digital converters, to determine if there is a discontinuity in the wiring.

Figure 2:
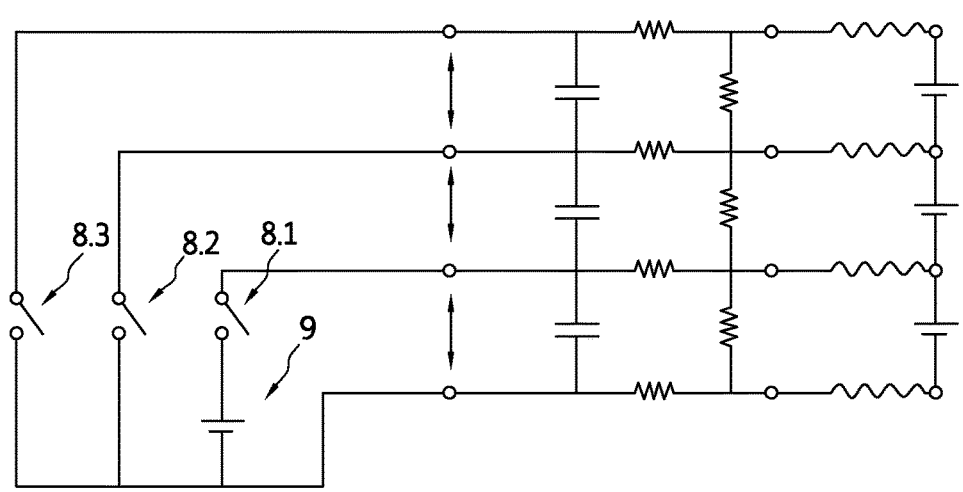
FIG. 2 shows a circuit of a fuel cell system according to FIG. 1 with an external voltage source between a minus pole of the fuel cell system and a switch.
Figure 3:
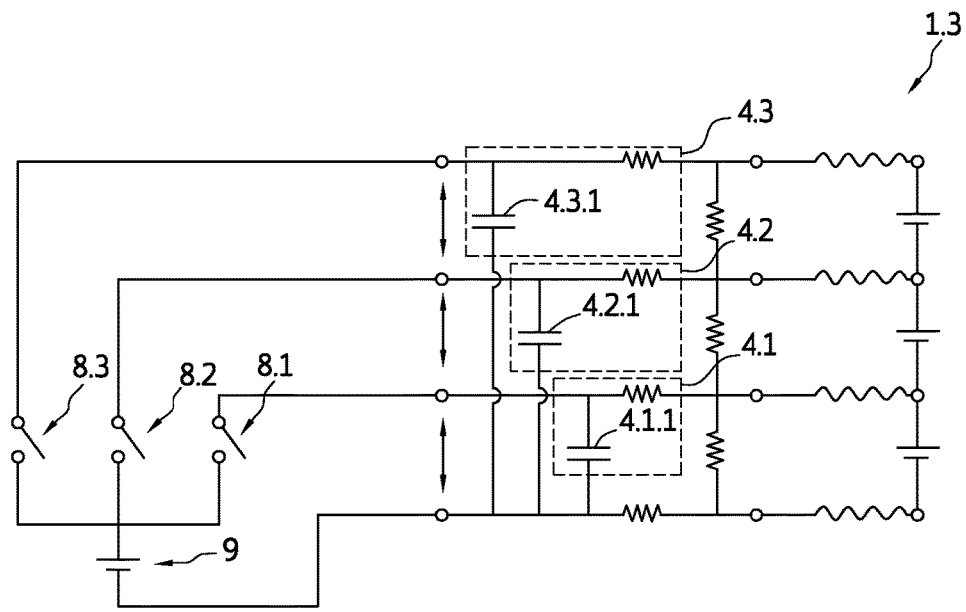
FIG. 3 shows a circuit of a fuel cell system according to FIG. 2, wherein the external voltage source is connected to all of the three switches.

With the connectivity check according to the first embodiment, a bad connection in the ground wire 3.0 leads to a differential voltage output of 0 V at output 7.1 which is sufficient to indicate a discontinuity. However, to make use of a uniform system of monitoring and to perform a connectivity check on the ground wire or cable 3.0 a circuit according to a second embodiment as shown in FIG. 2 is preferred. The circuit according to FIG. 2 is equivalent to the circuit according to FIG. 1, with the difference, that an external voltage source 9 is connected with one pole, e.g. its positive pole to the first switch 8.1 and with its other pole, e.g. its negative pole to the grounding resistance 6, whereby the voltage of the external voltage source 9 can be any suitable arbitrary voltage, e.g. the voltage supply of the voltage monitoring circuit or a reference voltage that differs from the nominal voltage of one power cell.

If the grounding wire or cable 3.0 is disconnected and the first switch 8.1 is closed an electric current of the external voltage supply 9 flows through the first low-pass filter 4.1, the first input resistance 5.1 and the grounding resistance 6. In case of opening the first switch 8.1 the first capacitance 4.1.1 discharges or charges, whereby the charging/discharging dynamic response is much slower, e.g. the voltage at half-life is much lower than in case of an intact grounding wire or cable 3.0 which can be detected by the relevant voltage monitoring unit, e.g. analogue to digital converter.

Since the voltage of a fuel cell can drop to the value of 0 V, a connectivity check according to FIG. 1 and/or FIG. 2 might give false results. In this case a circuit of a power cell, e.g. fuel cell system 1.3 according a third embodiment of the present invention as shown to FIG. 3 can be used, where the second pole, e.g. the positive pole of an external voltage source 9 is connected to each of the switches 8.1, 8.2 and 8.3 and the first pole, e.g. negative pole of the external voltage source 9 is connected to the grounding resistance 6. Again the output voltage of the external voltage source 9 can be of any arbitrary voltage. The first to third charge storage devices, e.g. first capacitance 4.1.1, the second capacitance 4.2.1 and the third capacitance 4.3.1 are all connected between the corresponding resistance 4.1.2, 4.2.2 and 4.2.3 and the ground, instead of being connected to the output of the adjacent low-pass filter, which is the case for the circuits 1.1 and 1.2 corresponding to FIG. 1 and FIG. 2. The first to third charge storage devices, e.g. the first capacitance 4.1.1, the second capacitance 4.2.1 and the third capacitance 4.3.1 and the corresponding resistances 4.1.2, 4.2.2 and 4.2.3 form low pass filters.

An alternative description of the circuit of the third embodiment is as follows which is functionally equivalent to the description above. The power cells 2.1 to 2.3 are connected in a first ladder circuit comprising the power cells 2.1 to 2.3 and first resistors 5.1 to 5.3. The "rungs" of the ladder are formed by the connections 3.0 to 3.3 which form first nodes between the power cells 2.1 to 2.3. Second nodes between the resistors 5.1 to 5.3 are individually connected to ground via series connections of charge storage devices, e.g. capacitors 4.1.1 to 4.3.1 and second resistors 4.1.2 to 4.3.2, in respective pairs. The resistors 4.1.2 to 4.3.2 are connected with normally open poles of switches 8.1 to 8.3 via third nodes. The third nodes are connected to voltage monitoring units, e.g. analogue to digital converters as described above as well as to the switches 8.1 to 8.3. The second pole, e.g. the positive pole of an external voltage source 9 is connected to each of the switches 8.1, 8.2 and 8.3 and the first pole, e.g. negative pole of the external voltage source 9 is connected to the grounding resistance 6. Again the output voltage of the external voltage source 9 can be of any arbitrary voltage.

Since the three power cells, e.g. fuel cells show a voltage of zero volts the three input resistances 5.1, 5.2 and 5.3 can be considered as short-circuited, in normal operation. In case of a discontinuity in the electrical supply, a transection of the second wire 3.2 for instance, a closed second switch 8.2 makes the electrical current of the external voltage source 9 flow through the second input resistance 5.2 and the third input resistance 5.3, which makes the discharging half-life of the second capacitance 4.2.1 higher than in a normal operation. This fact is detectable by the CVM at the second output 7.2.

Again the circuit 1.3 is not able to measure a bad connection of the ground wire or cable 3.0; this discrepancy is avoided in a circuit 1.4 according to FIG. 4. In circuit 1.4 the external voltage supply 9 is connected with its second pole, e.g. positive pole only to the second switch 8.2 and the third switch 8.3, but not to the first switch 8.1, and the first pole, e.g. the negative pole of the external voltage source 9 is connected to the first switch 8.1 and the resistance 6.

If the first switch 8.1 is closed the first capacitance 4.1.1 is at zero volts, since both electrodes of the first capacitance 4.1.1 are connected to the same electrical potential. If the first switch 8.1 is opened again the first capacitance 4.1.1 is charged through the first active resistance 4.1.2 and the ground resistance 6, since the first input resistance 5.1 is short-circuited by the first fuel cell 2.1. If the ground wire or cable 3.0 is disconnected the first input resistance 5.1 is not short-circuited anymore and the first capacitance 4.1.1 is charged through the first active resistance 4.1.2, the ground resistance 6 and the first input resistance 5.1, which makes the charging half-life of the first capacitance 4.1.1 much longer. This fact is detectable by the CVM via the first output 7.1.

As indicated above, the voltage monitoring units include analogue to digital converters. These may be part of a microcontroller, which can also include the three switches as well. The external voltage source 9 can also be part of the microcontroller, which simplifies the switching of the external voltage source 9 between the three switches 8.1, 8.2 and 8.3. Hence the switching of the three switches 8.1, 8.2 and 8.3 can also be controlled by the microcontroller. For example, the microcontroller can have analog input pins that can be used to monitor the voltages 7.1 to 7.3, e.g. the microcontroller has an analogue to digital converter for converting the analogue input values to digital values. Also in accordance with a further embodiment, the analogue inputs can be programmed to temporarily function as digital output pins with a low logic level signal and optionally a high level logic signal. Thus the analogue input pins can be monitoring the voltages 7.1 . . . 7.3 of any of the above embodiments (in which case the switches 8.1-3 are open circuit) or they can switch to a low logic level which effectively implements a shorted switch. This effectively implements switches 8.1 . . . 8.3 as in FIG. 1 with no additional hardware, thus providing discharging of the capacitors 4.1.1, 4.2.1 and 4.3.1. This is possible because the measuring points of the voltages 7.1 to 7.3 in all embodiments are identical to the contact nodes for the switches 8.1 to 8.3.

In accordance with a further embodiment, a high level digital output is provided on one pin thus implementing the switching to an external voltage source as for example to switch 8.1 of FIG. 2, charging the capacitor 4.1.1 to the microcontroller's power supply. In accordance with a further embodiment, the microcontroller not only measures the cell voltages, e.g. via analogue inputs, and also to provide the switching functions of switches 8.1-3 but it is also programmed to adapt the VSU setup to any one of the embodiments shown in FIGS. 1 to 4. Optionally the microcontroller may include decision software to decide on which setup is most appropriate (e.g. which of the configurations of FIG. 1, 2, 3 or 4 is best to implement). The monitoring of the dynamic voltage response of the charging capacitors time after opening 8.1.8.3, e.g. up to the time of the acquisition of the voltages 7.1 to 7.3 can easily be performed by the microcontroller. It can also compare the values acquired during the connectivity check to the expected value and report only the state of the connection, e.g. to a main controller (not shown) of the CVM.

The microcontroller may be implemented as hardware, computer software, or combinations of both. The microcontroller may include a general purpose processor, an embedded processor, an application specific integrated circuit (ASIC), a field programmable gate array (FPGA) or other programmable logic device, discrete gate or transistor logic, discrete hardware components, or any combination designed to perform the functions described herein. A processor may also be implemented as a combination of computing devices, e.g., a combination of an FPGA and a microprocessor, a plurality of microprocessors, one or more microprocessors in conjunction with an FPGA, or any other such configuration.

All connectivity checks for all cells in a stack can be performed by all voltage monitoring units simultaneously. The result of the connectivity check is only one bit per acquisition channel so the communication overhead to report the results back to the main controller is very limited.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for detecting a discontinuity in electrical connections of power cells in a power cell system, the power cell system having a plurality of series connected power cells and a plurality of electronic filters, each having a connection to an electrode of a power cell, each of the plurality of electronic filters comprising a resistance and a capacitor device connected to the resistance, the method comprising:
   discharging capacitor devices while maintaining the connections to the power cells,
   recharging the capacitor devices from the power cells; and
   monitoring a dynamic voltage on the capacitor devices to determine if there is a discontinuity in electrical connections to the power cells, whereby in case of disconnection or transection of one of the connections to the power cells, the capacitance of the capacitor device of the corresponding electronic filter is charged through adjacent electronic filters,
   wherein the electronic filters filter high frequency voltage changes.

2. The method according to claim 1, wherein the power cell system comprises switches, each of the switches being connected to an output of an electronic filter, the method comprising applying an external voltage between each of the switches and a pole of the power cell system.

3. The method of claim 2, comprising detecting a discontinuity in a grounding wire or cable, which is connected to the pole.

4. The method according to claim 3 wherein the discontinuity is detected in case the power cell has an output voltage of zero volts, or detecting connectivity at zero volts across a power cell.

5. The method of claim 1, further comprising limiting an output voltage of each power cell by wherein each resistance is a shunt resistor for connection across the corresponding power cell.

6. The method of claim 1 wherein the electronic filters operate without separate voltage supplies.

7. The method of claim 1 wherein the resistances are connected in series and connected in parallel to the power cells in a ladder circuit, the method comprising generating a plurality of voltages by generating an input voltage at each resistance for the corresponding electronic filter, wherein the generated input voltages are all equal.

8. The method of claim 1, wherein an electric switch is arranged for each electronic filter, the method comprising the electric switch changing a voltage at an output of the corresponding electronic filter.

9. The method of claim 8, wherein the changing of the voltage by the electric switch discharge or recharges the capacitor devices or
   wherein opening of the electric switch charges a capacitor device of the corresponding electronic filter via the corresponding power cell.

10. The method of claim 9, wherein in case of a discontinuity in an electrical connection of a power cell the method comprises charging device of an electronic filter through adjacent electronic filters.

11. The method of claim 1, wherein impedances of the electronic filters are equal, the method comprising in case of a discontinuity, generating a same output voltage at an output of each electronic filter.

12. A power cell system with means for detecting a discontinuity in electrical connections to power cells in the power cell system, the system comprising:
   a plurality of power cells and a plurality of electronic filters each having a connection to an electrode of a power cell, each of the plurality of electronic filters comprising a resistance and a capacitor connected to the resistance, the system being adapted to:
   simultaneously discharge the capacitors while maintaining the connections to the power cells,
   simultaneously recharge the capacitors from the power cells and
   monitor a dynamic voltage on the capacitor to determine if there is a discontinuity in electrical connections to the power cells,
   wherein in case of disconnection or transection of one of the connections to the power cells, the capacitor of the corresponding electronic filter is charged through adjacent electronic filters.

13. The power cell system according to claim 12, further comprising switches, each of the switches being connected to an output of an electronic filter, the system being adapted to apply an external voltage between each of the switches and a pole of the power cell system.

14. The power cell system of claim 13, adapted to detect a discontinuity in a grounding wire or cable, which is connected to the pole.

15. The power cell system according to claim 12, adapted to detect the discontinuity in case a power cell has an output voltage of zero volts or to detect connectivity at zero volts across a power cell.

16. The power cell system of claim 12, wherein each resistance is a shunt resistor for connection across the corresponding power cell to limit an output voltage of each power cell.

17. The power cell system of claim 12, wherein the electronic filters operate without separate voltage supplies.

18. The power cell system of claim 12, wherein the resistances are connected in series and connected in parallel to the power cells in a ladder circuit, and the system being adapted to generate an input voltage at each resistance for the corresponding electronic filter, wherein the generated input voltages are all equal.

19. The power cell system of claim 12, wherein an electric switch is arranged for each electronic filter, the electric switch being adapted to change a voltage at an output of the corresponding electronic filter.

20. The power cell system of claim 19, wherein the changing of the voltage by the electric switch discharges or recharges the capacitors.

21. The power cell system of claim 19, wherein opening of the electric switch charges a capacitor of the corresponding electronic filter via the corresponding power cell.

22. The power cell system of claim 12, wherein impedances of the electronic filters are equal, the system being adapted so that in case of a discontinuity, a same output voltage at an output of each electronic filter is generated.

23. A power cell system with means for detecting a discontinuity in electrical connections to power cells in the power cell system, the system comprising:
   a plurality of power cells and a plurality of electronic filters each having a connection to an electrode of a power cell, each of the plurality of electronic filters comprising a resistance and a capacitor connected to the resistance, the system being adapted to:

simultaneously discharge the capacitors while maintaining the connections to the power cells, simultaneously recharge the capacitors from the power cells and monitor a dynamic voltage on the capacitor to determine if there is a discontinuity in electrical connections to the power cells, the system further comprising switches, each of the switches being connected to an output of an electronic filter, and the system being adapted to apply an external voltage between each of the switches and a pole of the power cell system.

24. The power cell system of claim 23, adapted to detect a discontinuity in a grounding wire or cable, which is connected to the pole.

25. The power cell system according to claim 23, adapted to detect the discontinuity in case a power cell has an output voltage of zero volts or to detect connectivity at zero volts across a power cell.

26. The power cell system of claim 23, wherein each resistance is a shunt resistor for connection across the corresponding power cell to limit an output voltage of each power cell.

27. The power cell system of claim 23, wherein the electronic filters operate without separate voltage supplies.

28. The power cell system of claim 23, wherein the resistances are connected in series and connected in parallel to the power cells in a ladder circuit, and the system being adapted to generate an input voltage at each resistance for the corresponding electronic filter, wherein the generated input voltages are all equal.

29. The power cell system of claim 23, wherein an electric switch is arranged for each electronic filter, the electric switch being adapted to change a voltage at an output of the corresponding electronic filter.

30. The power cell system of claim 29, wherein the changing of the voltage by the electric switch discharges or recharges the capacitors.

31. The power cell system of claim 29, wherein opening of the electric switch charges a capacitor of the corresponding electronic filter via the corresponding power cell.

32. The power cell system of claim 23, wherein impedances of the electronic filters are equal, the system being adapted so that in case of a discontinuity, a same output voltage at an output of each electronic filter is generated.

33. A power cell system with means for detecting a discontinuity in electrical connections to power cells in the power cell system, the system comprising:

a plurality of power cells and a plurality of electronic filters each having a connection to an electrode of a power cell, each of the plurality of electronic filters comprising a resistance and a capacitor connected to the resistance, the system being adapted to:

simultaneously discharge the capacitors while maintaining the connections to the power cells, simultaneously recharge the capacitors from the power cells and monitor a dynamic voltage on the capacitor to determine if there is a discontinuity in electrical connections to the power cells, wherein an electric switch is arranged for each electronic filter, the electric switch being adapted to change a voltage at an output of the corresponding electronic filter.

34. The power cell system of claim 33, adapted to detect a discontinuity in a grounding wire or cable, which is connected to the pole.

35. The power cell system of claim 33, wherein the changing of the voltage by the electric switch discharges or recharges the capacitors.

36. The power cell system of claim 33, wherein opening of the electric switch charges a capacitor of the corresponding electronic filter via the corresponding power cell.

37. The power cell system of claim 33, wherein impedances of the electronic filters are equal, the system being adapted so that in case of a discontinuity, a same output voltage at an output of each electronic filter is generated.

* * * * *